(12) United States Patent
Klein et al.

(10) Patent No.: US 6,965,537 B1
(45) Date of Patent: Nov. 15, 2005

(54) MEMORY SYSTEM AND METHOD USING ECC TO ACHIEVE LOW POWER REFRESH

(75) Inventors: Dean A. Klein, Eagle, ID (US); John Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/931,353

(22) Filed: Aug. 31, 2004

(51) Int. Cl.$^7$ .............................................. G11C 7/00
(52) U.S. Cl. .................. 365/222; 365/200; 365/230.04
(58) Field of Search ........................... 365/222, 230.08, 365/230.04, 189.08, 200

(56) References Cited

U.S. PATENT DOCUMENTS

| | | | |
|---|---|---|---|
| 4,598,402 A | 7/1986 | Matsumoto et al. ........... 371/38 |
| 4,706,249 A | 11/1987 | Nakagawa et al. ........... 371/38 |
| 4,710,934 A | 12/1987 | Traynor ....................... 371/38 |
| 4,766,573 A | 8/1988 | Takemae .................... 365/222 |
| 4,780,875 A | 10/1988 | Sakai ........................... 371/38 |
| 4,858,236 A | 8/1989 | Ogasawara .................. 371/38 |
| 4,862,463 A | 8/1989 | Chen ............................. 371/38 |
| 4,937,830 A | 6/1990 | Kawashima et al. ....... 371/40.1 |
| 4,958,325 A | 9/1990 | Nakagome et al. ......... 365/206 |
| 5,056,089 A | 10/1991 | Furuta et al. .................. 371/3 |
| 5,172,339 A | 12/1992 | Noguchi et al. ............ 365/201 |
| 5,278,796 A | 1/1994 | Tillinghast et al. ......... 365/211 |
| 5,291,498 A | 3/1994 | Jackson et al. ............. 371/40.1 |
| 5,313,425 A | 5/1994 | Lee et al. .................... 365/201 |
| 5,313,464 A | 5/1994 | Reiff .......................... 371/2.1 |
| 5,313,475 A | 5/1994 | Cromer et al. ............. 371/40.1 |
| 5,321,661 A | 6/1994 | Iwakiri et al. .............. 365/222 |
| 5,335,201 A | 8/1994 | Walther et al. ............. 365/222 |
| 5,369,651 A | 11/1994 | Marisetty .................... 371/40.1 |
| 5,418,796 A | 5/1995 | Price et al. ................. 371/39.1 |
| 5,428,630 A | 6/1995 | Weng et al. ................ 371/40.1 |
| 5,432,802 A | 7/1995 | Tsuboi ........................ 371/40.1 |
| 5,446,695 A | 8/1995 | Douse et al. ................ 365/222 |
| 5,448,578 A | 9/1995 | Kim ............................ 371/40.4 |
| 5,450,424 A | 9/1995 | Okugaki et al. ........... 371/40.1 |
| 5,455,801 A | 10/1995 | Blodgett et al. ............. 365/222 |
| 5,481,552 A | 1/1996 | Aldereguia et al. ........ 371/40.1 |
| 5,509,132 A | 4/1996 | Matsuda et al. ............. 395/403 |
| 5,513,135 A | 4/1996 | Dell et al. ..................... 365/52 |
| 5,515,333 A | 5/1996 | Fujita et al. ................. 365/229 |
| 5,588,112 A | 12/1996 | Dearth et al. ........... 395/182.07 |
| 5,604,703 A * | 2/1997 | Nagashima .................. 365/200 |
| 5,623,506 A | 4/1997 | Dell et al. .................. 371/40.1 |
| 5,703,823 A | 12/1997 | Douse et al. ................ 365/222 |
| 5,706,225 A | 1/1998 | Buchenrieder et al. ..... 365/102 |
| 5,732,092 A | 3/1998 | Shinohara ................... 371/40.2 |

(Continued)

*Primary Examiner*—Son T. Dinh
*Assistant Examiner*—Hien Nguyen
(74) *Attorney, Agent, or Firm*—Dorsey & Whitney LLP

(57) ABSTRACT

Rows of DRAM memory cells are refreshed at either a relatively high rate during normal operation or a relatively slow rate in a reduced power refresh mode. Prior to refreshing the rows of memory cells, the data are read from the memory cells, and corresponding syndromes are generated and stored. When transitioning from the reduced power refresh mode, data from the rows of memory cells are read, and the stored syndromes are used to determine if there are errors in the read data. The syndromes are also used to correct any errors that are found, and the corrected data are written to the rows of memory cells. By correcting any errors that exist when transitioning from the reduced power refresh mode, it is not necessary to use the syndromes to detect and correct errors while operating in the reduced power refresh mode.

58 Claims, 5 Drawing Sheets

U.S. PATENT DOCUMENTS

| | | | |
|---|---|---|---|
| 5,740,188 A | 4/1998 | Olarig | 371/40.11 |
| 5,761,222 A | 6/1998 | Baldi | 371/40.18 |
| 5,765,185 A | 6/1998 | Lambrache et al. | 711/103 |
| 5,784,328 A | 7/1998 | Irrinki et al. | 365/222 |
| 5,784,391 A | 7/1998 | Konigsburg | 371/40.18 |
| 5,808,952 A | 9/1998 | Fung et al. | 365/222 |
| 5,841,418 A | 11/1998 | Bril et al. | 345/3 |
| 5,864,569 A | 1/1999 | Roohparvar | 371/40.18 |
| 5,878,059 A | 3/1999 | Maclellan | 371/40.13 |
| 5,896,404 A | 4/1999 | Kellogg et al. | 371/40.11 |
| 5,912,906 A | 6/1999 | Wu et al. | 371/40.11 |
| 5,961,660 A | 10/1999 | Capps, Jr. et al. | 714/763 |
| 5,963,103 A | 10/1999 | Blodgett | 331/75 |
| 6,009,547 A | 12/1999 | Jaquette et al. | 714/758 |
| 6,009,548 A | 12/1999 | Chen et al. | 714/762 |
| 6,018,817 A | 1/2000 | Chen et al. | 714/762 |
| 6,041,001 A | 3/2000 | Estakhri | 365/200 |
| 6,092,231 A | 7/2000 | Sze | 714/758 |
| 6,101,614 A | 8/2000 | Gonzales et al. | 714/6 |
| 6,125,467 A | 9/2000 | Dixon | 714/763 |
| 6,134,167 A | 10/2000 | Atkinson | 365/222 |
| 6,178,537 B1 | 1/2001 | Roohparvar | 714/773 |
| 6,212,631 B1 | 4/2001 | Springer et al. | 713/1 |
| 6,216,246 B1 | 4/2001 | Shau | 714/763 |
| 6,216,247 B1 | 4/2001 | Creta et al. | 714/763 |
| 6,219,807 B1 | 4/2001 | Ebihara et al. | 714/720 |
| 6,223,309 B1 | 4/2001 | Dixon et al. | 714/703 |
| 6,233,717 B1 | 5/2001 | Choi | 714/805 |
| 6,262,925 B1 | 7/2001 | Yamasaki | 365/200 |
| 6,279,072 B1 | 8/2001 | Williams et al. | 711/105 |
| 6,349,390 B1 | 2/2002 | Dell et al. | 714/6 |
| 6,353,910 B1 | 3/2002 | Carnevale et al. | 714/763 |
| 6,397,290 B1 | 5/2002 | Williams et al. | 711/105 |
| 6,397,357 B1 | 5/2002 | Cooper | 714/703 |
| 6,397,365 B1 | 5/2002 | Brewer et al. | 714/766 |
| 6,457,153 B2 | 9/2002 | Yamamoto et al. | 714/763 |
| 6,510,537 B1 * | 1/2003 | Lee | 714/763 |
| 6,526,537 B2 | 2/2003 | Kishino | 714/763 |
| 6,556,497 B2 | 4/2003 | Cowles et al. | 365/222 |
| 6,557,072 B2 | 4/2003 | Osborn | 711/106 |
| 6,560,155 B1 | 5/2003 | Hush | 365/222 |
| 6,584,543 B2 | 6/2003 | Williams et al. | 711/105 |
| 6,591,394 B2 | 7/2003 | Johnson et al. | 714/766 |
| 6,594,796 B1 | 7/2003 | Chiang | 714/800 |
| 6,601,211 B1 | 7/2003 | Norman | 714/773 |
| 6,603,694 B1 | 8/2003 | Frankowsky et al. | 365/222 |
| 6,618,281 B1 | 9/2003 | Gordon | 365/49 |
| 6,628,558 B2 | 9/2003 | Fiscus | 365/222 |
| 6,646,942 B2 | 11/2003 | Janzen | 365/222 |
| 6,662,333 B1 | 12/2003 | Zhang et al. | 714/767 |
| 6,678,860 B1 | 1/2004 | Lee | 714/763 |
| 6,701,480 B1 | 3/2004 | Karpuszka et al. | 714/764 |
| 6,704,230 B1 | 3/2004 | DeBrosse et al. | 365/201 |
| 6,715,116 B2 | 3/2004 | Lester et al. | 714/718 |
| 6,751,143 B2 | 6/2004 | Morgan et al. | 365/222 |
| 6,754,858 B2 | 6/2004 | Borkenhagen et al. | 714/720 |
| 6,778,457 B1 | 8/2004 | Burgan | 365/222 |
| 6,781,908 B1 | 8/2004 | Pelley et al. | 365/222 |
| 6,792,567 B2 | 9/2004 | Laurent | 714/763 |
| 6,795,362 B2 | 9/2004 | Nakai et al. | 365/222 |
| 2001/0023496 A1 | 9/2001 | Yamamoto et al. | 714/763 |
| 2001/0029592 A1 | 10/2001 | Walker et al. | 714/42 |
| 2001/0044917 A1 | 11/2001 | Lester et al. | 714/718 |
| 2001/0052090 A1 | 12/2001 | Mio | 714/42 |
| 2001/0052102 A1 | 12/2001 | Roohparvar | 714/773 |
| 2002/0013924 A1 | 1/2002 | Yamasoto | 714/763 |
| 2002/0029316 A1 | 3/2002 | Williams et al. | 711/105 |
| 2002/0144210 A1 | 10/2002 | Borkenhagen et al. | 714/805 |
| 2002/0152444 A1 | 10/2002 | Chen et al. | 714/785 |
| 2002/0162069 A1 | 10/2002 | Laurent | 714/763 |
| 2002/0184592 A1 | 12/2002 | Koga et al. | 714/763 |
| 2003/0009721 A1 | 1/2003 | Hsu et al. | 714/773 |
| 2003/0070054 A1 | 4/2003 | Williams et al. | 711/173 |
| 2003/0093744 A1 | 5/2003 | Leung et al. | 714/763 |
| 2003/0097608 A1 | 5/2003 | Rodeheffer et al. | 714/7 |
| 2003/0101405 A1 | 5/2003 | Shibata | 714/763 |
| 2003/0149855 A1 | 8/2003 | Shibata et al. | 711/200 |
| 2003/0167437 A1 | 9/2003 | DeSota et al. | 714/763 |
| 2003/0191888 A1 | 10/2003 | Klein | 711/105 |
| 2004/0008562 A1 | 1/2004 | Ito et al. | 365/223 |
| 2004/0064646 A1 | 4/2004 | Emerson et al. | 711/131 |
| 2004/0083334 A1 | 4/2004 | Chang et al. | 711/103 |
| 2004/0098654 A1 | 5/2004 | Cheng et al. | 714/758 |
| 2004/0117723 A1 | 6/2004 | Foss | 714/805 |
| 2004/0225944 A1 | 11/2004 | Brueggen | 714/758 |

\* cited by examiner

MEMORY SYSTEM AND METHOD USING ECC TO ACHIEVE LOW POWER REFRESH

TECHNICAL FIELD

This invention relates to dynamic random access memory ("DRAM") devices, and, more particularly, to a method and system for checking and correcting data read from DRAM devices to allow the DRAM devices to consume relatively little power during refresh.

BACKGROUND OF THE INVENTION

As the use of electronic devices, such as personal computers, continue to increase, it is becoming ever more important to make such devices portable. The usefulness of portable electronic devices, such as notebook computers, is limited by the limited length of time batteries are capable of powering the device before needing to be recharged. This problem has been addressed by attempts to increase battery life and attempts to reduce the rate at which such electronic devices consume power.

Various techniques have been used to reduce power consumption in electronic devices, the nature of which often depends upon the type of power consuming electronic circuits that are in the device. For example, electronic devices such a notebook computers, typically include dynamic random access memory ("DRAM") devices that consume a substantial amount of power. As the data storage capacity and operating speeds of DRAM devices continues to increase, the power consumed by such devices has continued to increase in a corresponding manner.

In general, the power consumed by a DRAM device increases with both the capacity and the operating speed of the DRAM devices. The power consumed by DRAM devices is also affected by their operating mode. A DRAM device for example, will generally consume a relatively large amount of power when the memory cells of the DRAM device are being refreshed. As is well-known in the art, DRAM memory cells, each of which essentially consists of a capacitor, must be periodically refreshed to retain data stored in the DRAM device. Refresh is typically performed by essentially reading data bits from the memory cells in each row of a memory cell array and then writing those same data bits back to the same cells in the row. A relatively large amount of power is consumed when refreshing a DRAM because rows of memory cells in a memory cell array are being actuated in the rapid sequence. Each time a row of memory cells is actuated, a pair of digit lines for each memory cell are switched to complementary voltages and then equilibrated. As a result, DRAM refreshes tends to be particularly power-hungry operations. Further, since refreshing memory cells must be accomplished even when the DRAM is not being used and is thus inactive, the amount of power consumed by refresh is a critical determinant of the amount of power consumed by the DRAM over an extended period. Thus many attempts to reduce power consumption in DRAM devices have focused on reducing the rate at which power is consumed during refresh.

Refresh power can, of course, be reduced by reducing the rate at which the memory cells in a DRAM are being refreshed. However, reducing the refresh rate increases the risk that data stored in the DRAM memory cells will be lost. More specifically, since, as mentioned above, DRAM memory cells are essentially capacitors, charge inherently leaks from the memory cell capacitors, which can change the value of a data bit stored in the memory cell over time. However, current leaks from capacitors at varying rates. Some capacitors are essentially short-circuited and are thus incapable of storing charge indicative of a data bit. These defective memory cells can be detected during production testing, and can then be repaired by substituting non-defective memory cells using conventional redundancy circuitry. On the other hand, current leaks from most DRAM memory cells at much slower rates that span a wide range. A DRAM refresh rate is chosen to ensure that all but a few memory cells can store data bits without data loss. This refresh rate is typically once every 64 ms. The memory cells that cannot reliably retain data bits at this refresh rate are detected during production testing and replaced by redundant memory cells.

One technique that has been used to prevent data errors is to generate an error correcting code "ECC," which is known as a "syndrome," from each item of stored data, and then store the syndrome along with the data. When the data are read from the memory device, the syndrome is also read, and it is then used to determine if any bits of the data are in error. As long as not too many data bits are in error, the syndrome may also be used to correct the read data.

A conventional computer system 10 employing ECC techniques is shown in FIG. 1. The computer system 10 includes a central processor unit ("CPU") 14 coupled to a system controller 16 through a processor bus 18. The system controller 16 is coupled to input/output ("I/O") devices (not shown) through a peripheral bus 20 and to an I/O controller 24 through an expansion bus 26. The I/O controller 24 is also connected to various peripheral devices (not shown) through an I/O bus 28.

The system controller 16 includes a memory controller 30 that is coupled to a dynamic random access memory ("DRAM") 32 through an address bus 36, a control bus 38, a syndrome bus 40, and a data bus 42. The DRAM 32 includes an array 34 of memory cells that stores data and a syndrome coupled through the data bus 42 and the syndrome bus 40, respectively. The locations in the DRAM 32 to which data are written and data are read are designated by addresses coupled to the DRAM 32 on the address bus 36. The operation of the DRAM is controlled by control signals coupled to the DRAM 32 on the control bus 38. These control signals can cause the DRAM 32 to operate in various refresh modes, such as a "self-refresh" mode in periodic refresh cycles are periodically initiated without the need to apply control signals to the DRAM 32. The DRAM 32 also includes a mode register 44 that stores several bits that can be set or reset to control the operating mode of the DRAM 32.

When data are to be written to the DRAM 32, the memory controller 30 generates a syndrome and then couples the syndrome and the write data to the DRAM 32 through the syndrome bus 40 and the data bus 42, respectively. The memory controller 30 also couples control signals to the DRAM 32 through the control bus 38 and a memory address through the address bus 36. The data are then stored in an array 34 of DRAM memory cells. When the stored data are to be read from the DRAM 32, the memory controller 30 applies control signals to the DRAM 32 through the control bus 38 and a memory address to the DRAM 32 through the address bus 36. Read data and the corresponding syndrome are then coupled from the DRAM 32 to the memory controller 30 through the data bus 42 and syndrome bus 40, respectively. The memory controller 30 then uses the syndrome to determine if any bits of the read data are in error, and, if not too many bits are in error, to correct the read data.

The use of ECC techniques can significantly improve the reliability of data stored in the DRAM 32. Furthermore, the use of ECC techniques could allow the DRAM 32 to be refreshed at a slower refresh rate since resulting data bit errors could be corrected. The use of a slower refresh rate could provide the significant advantage of reducing the power consumed by the DRAM 32. However, if the memory controller 30 was not operating in an ECC mode when the DRAM 32 entered a refresh cycle, it would be necessary to perform the refresh at the normal, relatively high rate. Using ECC techniques as the DRAM 32 enters refresh will not suffice to allow refresh to occur at a reduced rate because no ECC syndromes will have been stored in the DRAM 32 at that time. Further, if the memory controller 30 is performing an ECC function, the reduced power advantages made possible by using ECC techniques would not be obtained unless the operation of the DRAM 32 was altered to take advantage of the ECC capability by reducing the refresh rate.

There is therefore a need for a memory system and method that is effective in allowing a DRAM to operate in a reduced power refresh mode by using ECC techniques to correct errors that might develop during the reduced power refresh.

SUMMARY OF THE INVENTION

An error checking and correcting memory device and method refreshes memory cells in either a normal operating mode or a reduced power refresh mode, which is significantly slower than the refresh rate in normal operation. Prior to transitioning from the normal operating mode to the reduced power refresh mode, data from the memory cells in each of a plurality of the rows are read and coupled to error checking and correcting logic, which generates syndromes corresponding to the read data. The data are then stored, preferably in the memory device, such as in the array of memory cells in which the data are stored. When transitioning from the reduced power refresh mode to the normal operating mode, the data are read from the memory cells and coupled to the error checking and correcting logic along with the stored syndromes. The error checking and correcting logic uses the syndromes to check for errors in the data read from the memory cells and to correct any errors that are found. The corrected data are then written to the memory cells so that any errors arising from the relatively slow refresh rate are no longer present.

DETAILED DESCRIPTION

Figure 1:
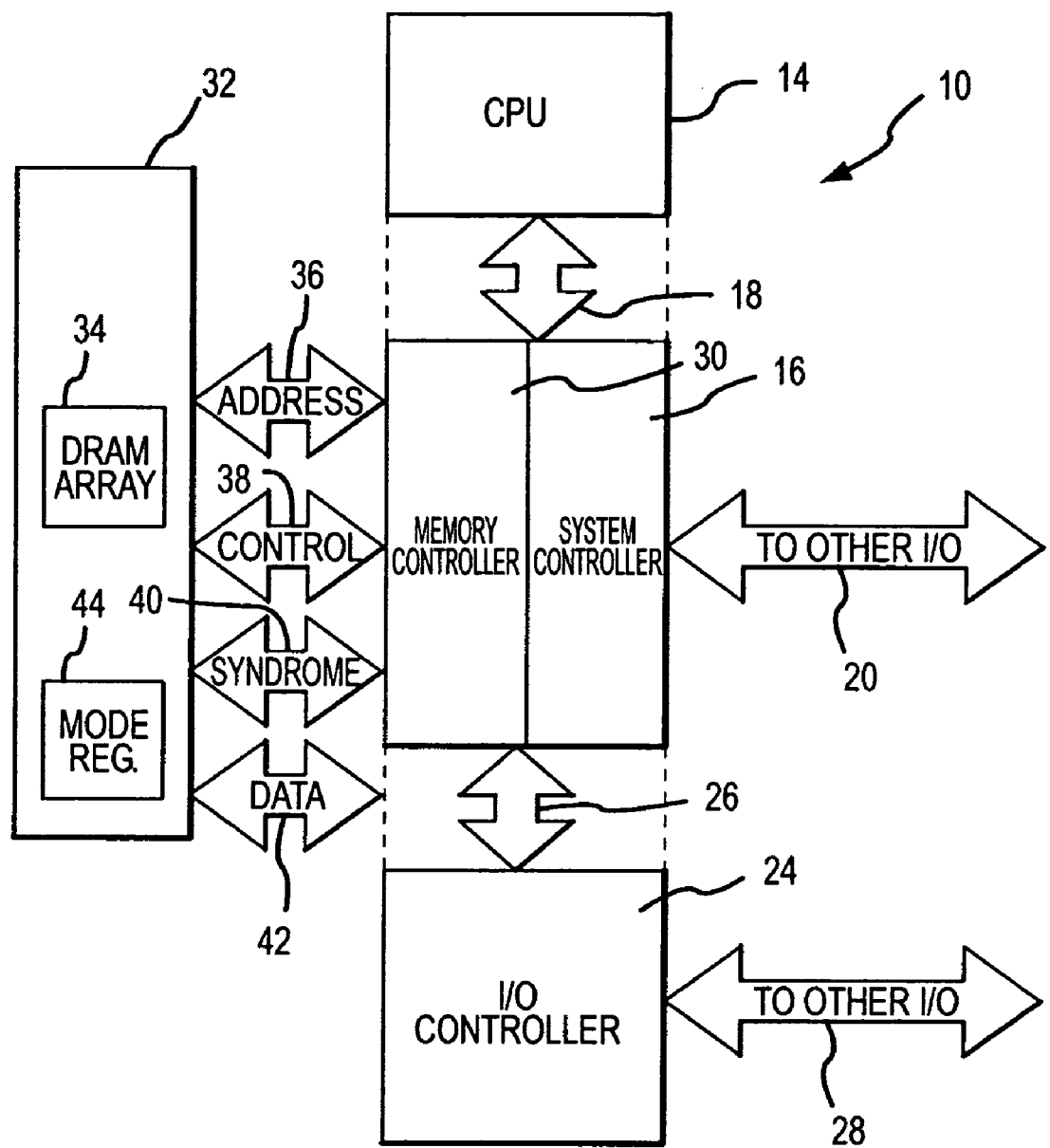
FIG. 1 is a block diagram of a conventional computer system.
Figure 2:
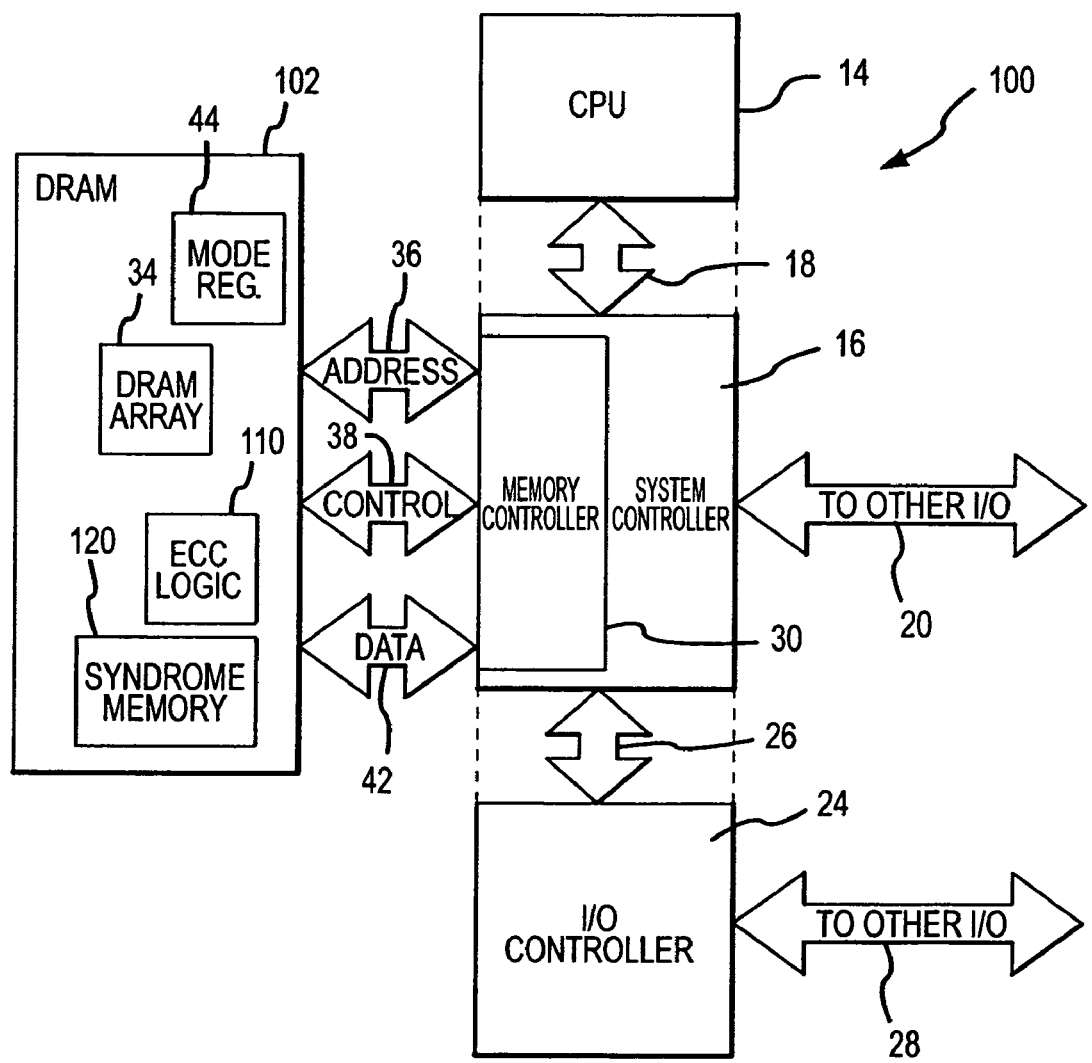
FIG. 2 is a block diagram of a computer system according to one embodiment of the invention.

A computer system 100 according to one embodiment of the invention is shown in FIG. 2. The computer system 100 uses many of the same components that are used in the conventional computer system 10 of FIG. 1. Therefore, in the interest of brevity, these components have been provided with the same reference numerals, and an explanation of their operation will not be repeated. The computer system 100 of FIG. 2 differs from the computer system 10 of FIG. 1 by including a DRAM 102 that includes a syndrome memory 120 and ECC logic 110, and by omitting a syndrome bus. As explained in greater detail below, prior to entering a reduced power refresh mode, the ECC logic 110 generates a syndrome from data stored in the DRAM array 34 and then stores the syndrome in the syndrome memory 120. The ECC logic 110 uses the stored syndromes to check and then correct data read from the DRAM array 34 during low power refresh, which occurs at a rate that is sufficiently low that data retention errors can be expected. In the event an error has developed, the ECC logic corrects the data using the stored syndrome, and the corrected data are written to the DRAM array 34. As a result, a refresh mode, such as self-refresh, can occur at a relatively low rate. When DRAM 32 exits the reduced power refresh mode, the DRAM can (but need not) operate in the normal manner without generating syndromes and using the syndromes to check data and correct errors. Although the syndrome memory 120 may be a separate memory as shown in FIG. 2, it may alternatively be included in the DRAM array 34, as explained in greater detail below.

Figure 3:
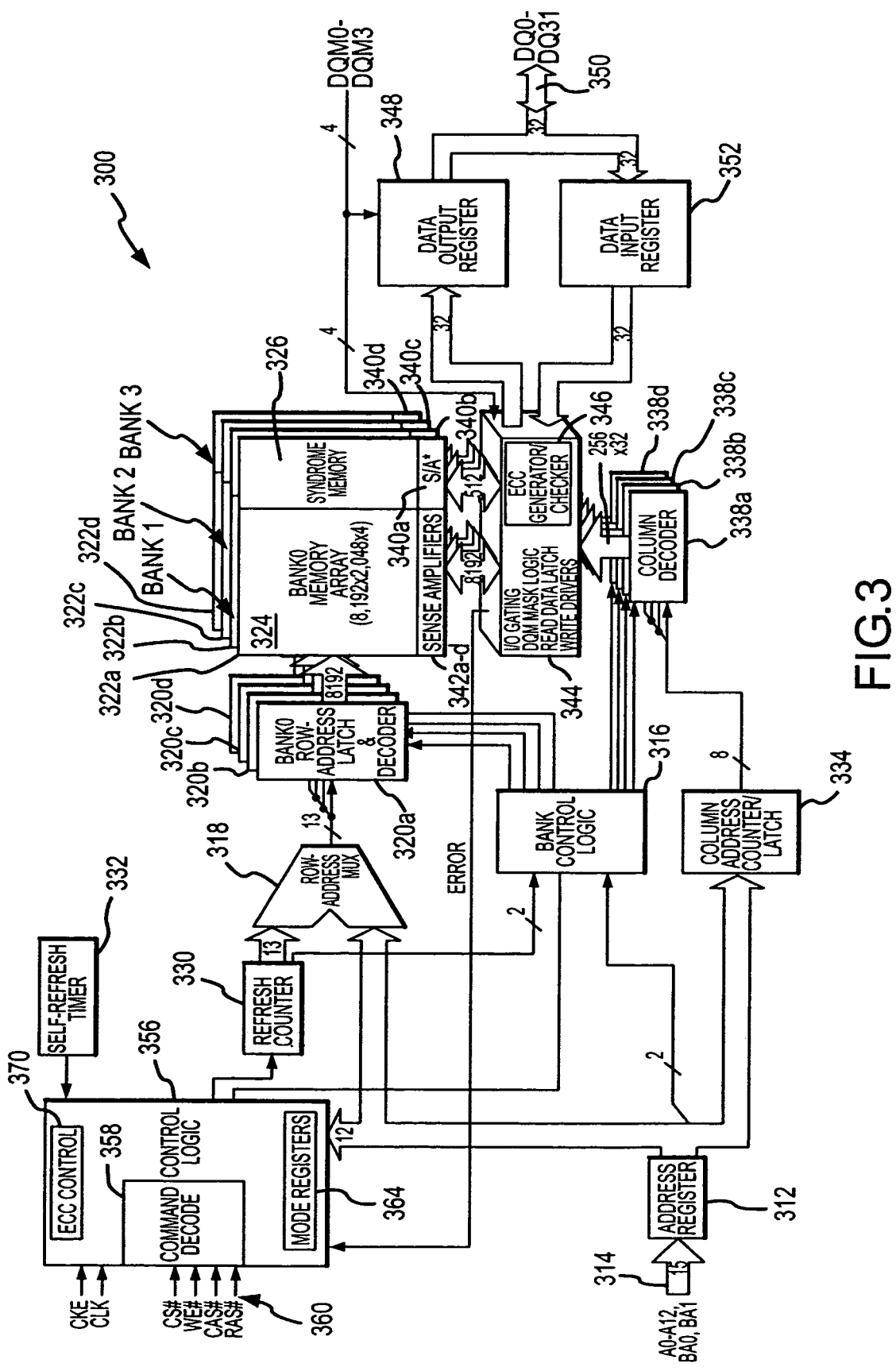
FIG. 3 is a block diagram of a memory device according to one embodiment of the invention that may be used in the computer system of FIG. 2.

A synchronous DRAM ("SDRAM") 300 according to one embodiment of the invention is shown in FIG. 3. The SDRAM 300 includes an address register 312 that receives bank addresses, row addresses and column addresses on an address bus 314. The address bus 314 is generally coupled to a memory controller (not shown in FIG. 3). Typically, a bank address is received by the address register 312 and is coupled to bank control logic 316 that generates bank control signals, which are described further below. The bank address is normally coupled to the SDRAM 300 along with a row address. The row address is received by the address register 312 and applied to a row address multiplexer 318. The row address multiplexer 318 couples the row address to row address latch & decoder circuit 320a–d for each of several banks of memory cell arrays 322a–d, respectively. Each bank 320a–d is divided into two sections, a data section 324 that is used for storing data, and a syndrome section 326 that is used for storing syndromes. Thus, unlike the SDRAM 102 of FIG. 2, a separate syndrome memory 120 is not used in the SDRAM 300 of FIG. 3.

One of the latch & decoder circuits 320a–d is enabled by a control signal from the bank control logic 316 depending on which bank of memory cell arrays 322a–d is selected by the bank address. The selected latch & decoder circuit 320 applies various signals to its respective bank 322 as a function of the row address stored in the latch & decoder circuit 320. These signals include word line voltages that activate respective rows of memory cells in the banks 322. The row address multiplexer 318 also couples row addresses to the row address latch & decoder circuits 320a–d for the purpose of refreshing the memory cells in the banks 322a–d. The row addresses are generated for refresh purposes by a refresh counter 330. During operation in a self-refresh mode, the refresh counter 330 periodically begins operating at times controlled by a self-refresh timer 332. As explained in greater detail below, the self-refresh timer 332 causes the memory cells in the banks 322 to be refreshed at a rate that is sufficiently low that data errors are likely to occur.

However, refreshing the memory cells in the banks 322a–d at this relatively low rate reduces the power consumption during self-refresh.

After the bank and row addresses have been applied to the address register 312, a column address is applied to the address register 312. The address register 312 couples the column address to a column address counter/latch circuit 334. The counter/latch circuit 334 stores the column address, and, when operating in a burst mode, generates column addresses that increment from the received column address. In either case, either the stored column address or incrementally increasing column addresses are coupled to column address decoders 338a–d for the respective banks 322a–d. The column address decoders 338a–d apply various signals to respective sense amplifiers 340a–d and 342a–d through column interface circuitry 344. The column interface circuitry 344 includes conventional I/O gating circuits, DQM mask logic, read data latches for storing read data from the memory cells in the banks 322 and write drivers for coupling write data to the memory cells in the banks 322. The column interface circuitry 344 also includes an ECC generator/checker 346 that essentially performs the same function as the ECC logic 110 in the DRAM 102 of FIG. 2. Although the column address decoders 338a–d are shown in FIG. 3 as being "upstream" from the column interface circuitry 344. However, it will be understood they can be in some other location, such as part of the column interface circuitry 344 or between the column interface circuitry 344 and the sense amplifiers 342a–d.

Syndromes read from the syndrome section 326 of one of the banks 322a–d are sensed by the respective set of sense amplifiers 340a–d and then coupled to the ECC generator checker 346. Data read from the data section 324 one of the banks 322a–d are sensed by the respective set of sense amplifiers 342a–d and then stored in the read data latches in the column interface circuitry 344. The data are then coupled to a data output register 348, which applies the read data to a data bus 350. Data to be written to the memory cells in one of the banks 322a–d are coupled from the data bus 350 through a data input register 352 to write drivers in the column interface circuitry 344. The write drivers then couple the data to the memory cells in one of the banks 322a–d. A data mask signal "DQM" is applied to the column interface circuitry 344 and the data output register 348 to selectively alter the flow of data into and out of the column interface circuitry 344, such as by selectively masking data to be read from the banks of memory cell arrays 322a–d.

The above-described operation of the SDRAM 300 is controlled by control logic 356, which includes a command decoder 358 that receives command signals through a command bus 360. These high level command signals, which are typically generated by a memory controller (not shown in FIG. 5), are a clock, a chip select signal CS#, a write enable signal WE#, a column address strobe signal CAS#, and a row address strobe signal RAS#, with the "#" designating the signal as active low. Various combinations of these signals are registered as respective commands, such as a read command or a write command. The control logic 356 also receives a clock signal CLK and a clock enable signal CKE#, which cause the SDRAM 300 to operate in a synchronous manner. The control logic 356 generates a sequence of control signals responsive to the command signals to carry out the function (e.g., a read or a write) designated by each of the command signals. The control logic 356 also applies signals to the refresh counter 330 to control the operation of the refresh counter 330 during refresh of the memory cells in the banks 322. The control signals generated by the control logic 356, and the manner in which they accomplish their respective functions, are conventional. Therefore, in the interest of brevity, a further explanation of these control signals will be omitted.

The control logic 356 also includes a mode register 364 that may be programmed by signals coupled through the command bus 360 during initialization of the SDRAM 300. The mode register 364 then generates mode control signals that are used by the control logic 356 to control the operation of the SDRAM 300 in various modes. One bit of the mode register 364 may be an ECC mode bit that, when set, causes the SDRAM 300 to operate in an ECC mode during normal operation. The mode register 364 may also include a bit that, when set, allows the SDRAM 300 to operate in a reduced power, self-refresh ECC mode, which will be described in greater detail below. Finally, the control logic 356 also includes an ECC controller 370 that causes the control logic 356 to issue control signals to the ECC generator checker 346 and other components to generate syndromes for storage in the syndrome section 326 of the banks 322a–d, and to check and correct data read from the data section 324 of the banks 322a–d using syndromes stored in the sections 326. The ECC controller 370 may be enabled by signals from the mode register 364 to control the operation of the SDRAM 300 in the ECC mode or in the reduced power, self-refresh ECC mode, which is explained in greater detail below.

Figure 4:
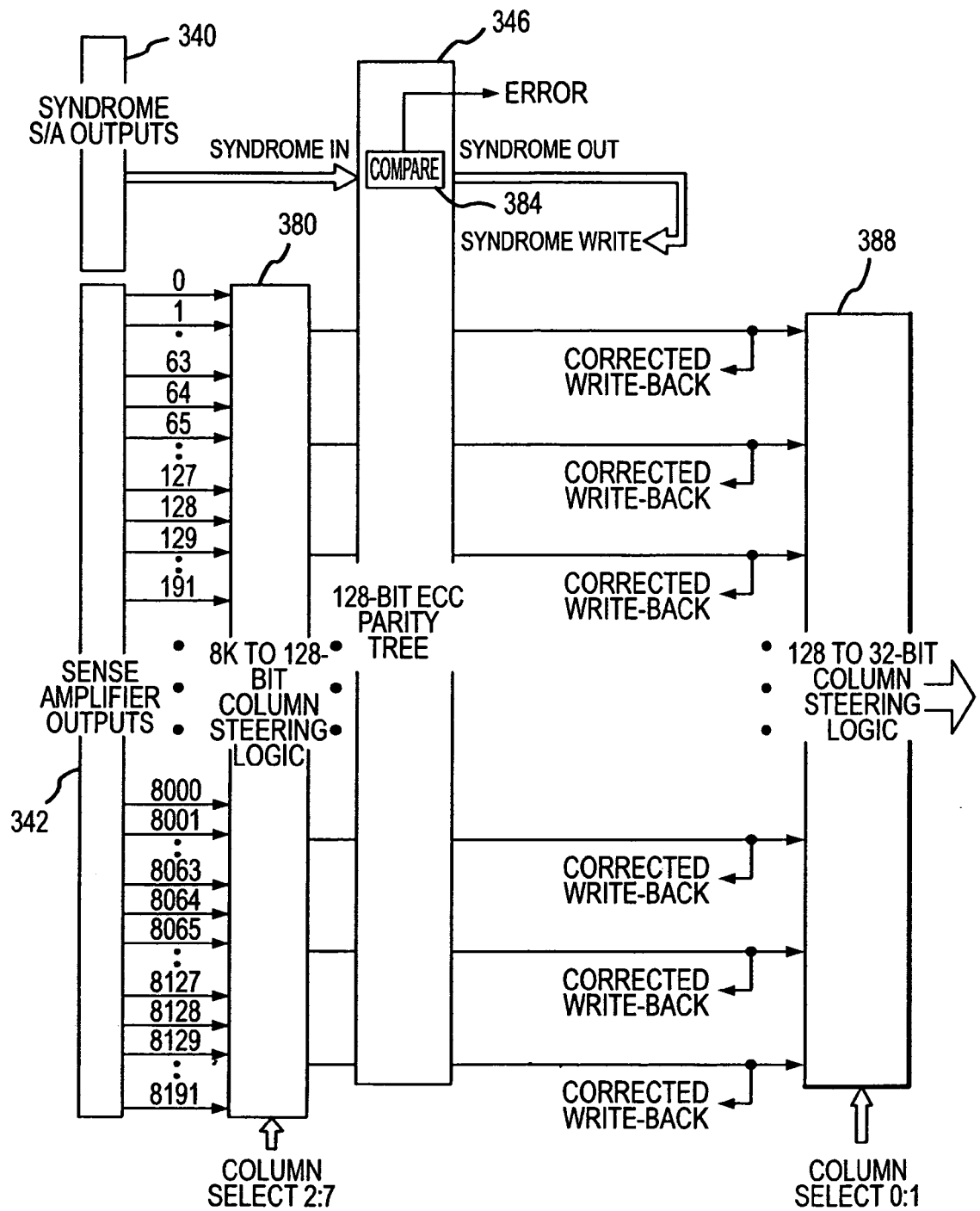
FIG. 4 is a block diagram showing a portion of the memory device of FIG. 3 in greater detail.

The interfaces between the sense amplifiers 340, 342, the ECC generator/checker 346 and certain components in the column interface circuitry 344 are shown in greater detail in FIG. 4. The sense amplifiers 342 coupled to the data sections 342 of the memory banks 322a–d output respective data bits for respective columns, which are applied to column steering logic 380. In the embodiment shown in FIG. 4, the sense amplifiers 342 output respective data bits for 8,192 columns. The column steering logic 380 uses the 6 most significant bits 2–7 of a column address to select 1 of 64 128-bit groups of data bits and couples the data bits to the ECC generator/checker 346. The sense amplifiers 340 coupled to the syndrome section of the memory banks 322a–d couple a syndrome corresponding to the read data directly to the ECC generator/checker 346.

The ECC generator/checker 346 includes a comparator 384 that provides an error indication in the event the read data contains an error. The ECC generator/checker 346 then couples the corrected 128-bit word back through the column steering logic 380 to the banks 322a–d so that the banks will now contain correct data. In the ECC mode, the ECC generator/checker 346 also couples the corrected 128-bit word to additional column steering logic 388. The column steering logic 388 uses the 2 least significant bits 0–1 of a column address to select 1 of 4 32-bit groups of data bits and couples the data bits to a memory controller, such as the memory controller 30 of FIG. 2, as previously explained. It is not necessary for the column steering logic 388 to couple the syndrome to the memory controller 30 so that the error checking and correction function is transparent to the memory controller 30. Also, although 128 bits of write data are used to form the syndrome, it is not necessary for the memory device 102 to include externally accessible data terminals for each of these 128 bits.

The operation of the SDRAM 300 in the reduced power, self-refresh ECC mode will now be explained with reference to the flow chart of FIG. 5. The mode is entered at 400, and a self-refresh preparation step 404 is then executed. In this preparation step 404, syndromes are generated for the data stored in all or a specified portion of the memory banks 322a–d. More specifically, the refresh counter 330 is set to row "I", and it increments from that value until it has been incremented to row "N." The rows from "I" to "N" will therefore be read. Reading the data stored in each of the rows will also refresh the memory cells in the rows, as is well-known to one skilled in the art. In the event "I" is set to 0 and "N" is set to the last row of one of the banks 222a–d, all of the memory cells in the bank will be read. By allowing the rows to be selected for which syndromes are generated, it is not necessary to waste power generating and then storing syndromes for rows that are either not storing data or are storing data that need not be free of errors.

As each row is read, the data bits stored in the memory cells of the row are coupled to the ECC generator checker 346, which generates one or more syndromes corresponding to one or more groups of data bits coupled from the memory cells. After each syndrome is obtained, it is written to the syndrome section 326 for the corresponding bank. In the event there are several syndromes for each row, the syndromes are preferably stored in the syndrome section 326 by a series of write operations, which preferably occur in a bursting manner. In another embodiment, the ECC generator checker 346 accumulates groups of read data bits until the data bits for the entire row have been accumulated. A syndrome is then generated for all of the data bits in the row, and this syndrome is then written to the syndrome section 329 for the corresponding bank. The advantage of this later approach is that generating a syndrome from the data bits in an entire row results in a syndrome having a few number of bits compared to the number of bits in the syndromes for smaller groups of data bits in that row. As a result, the ECC overhead is relatively low. Other variations will be apparent to one skilled in the art. For example, in one embodiment, the preparation step 404 can be aborted at any time as long as the current refresh rate is sufficiently high. At this point, the preparation step 404 has been completed.

When the preparation step 404 has been completed, syndromes will be stored in the syndrome sections 326 of the banks 322a–d for all or a specified portion of the memory cells in the corresponding banks 322a–d. The refresh rate is then slowed to a relatively low rate at step 410. The reduced rate reduces the power consumed by the SDRAM 300, as previously explained. The degree to which refresh can be reduced will depend upon the amount of data storage errors that are acceptable. Excessively reducing the refresh rate may result in too many data storage errors being generated to be corrected by the syndromes since there is a limit to how many bits on a word can be corrected by a corresponding syndrome.

After resetting the refresh counter 330 to zero by setting the variable "I" to 0 at step 412, a check is made at step 416 to determine if the SDRAM 300 should exit the reduced power, self-refresh ECC mode. If not, the operation proceeds to step 420 where a row of memory cells specified by a count RC of the refresh counter 330 is refreshed in a conventional manner. Note that the stored syndromes are preferably not used to check and possibly correct the stored data as each row is refreshed. The refresh counter 330 is then incremented at 324, and a check is also made to determine if the row that was just refreshed is the last row that is to be refreshed. If so, the refresh counter 330 is reset to zero at step 324, and refresh of the rows of memory cells is then repeated through steps 416–424 until a command is applied to the command decoder 358 to exit self-refresh.

When a determination is made to leave the self refresh mode at step 416, the refresh rate may be increased to a normal, relatively high rate at step 430 by suitable means, such as by increasing the rate at which the refresh counter 330 is incremented. The self-refresh exit procedure then proceeds to step 434 where the data bits stored in the data section 324 and the syndromes stored in the syndrome section 326 of the refreshed rows are coupled to the ECC generator checker 346. Performing these steps at an increased rate gives the advantage of correcting the stored data as quickly as possible, thereby minimizing the time required to transition to the normal operating mode. The syndromes read from the syndrome section 326 are used to check if the read from the data section 324 are in error. If so, the syndromes are used to correct the read data, and the corrected read data are written to the data section 324 of the memory banks 322a–d. The SDRAM 300 then returns to normal operation through 438. At this point, valid data will be stored in all memory locations in the selected portions of the banks 322a–d, and refresh of the memory cells occurs in the normal manner.

Figure 5:
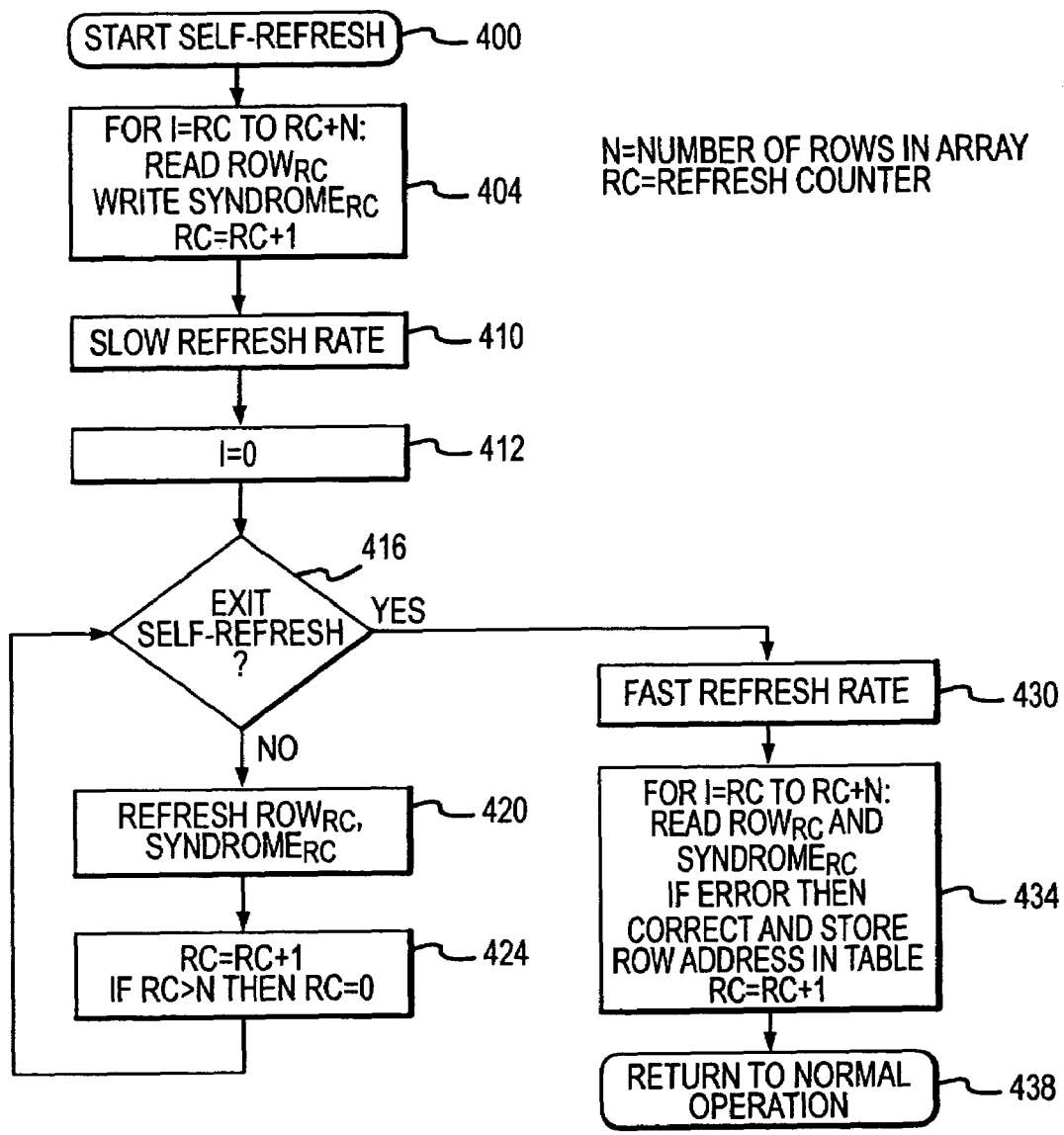
FIG. 5 is a flow chart showing the operation of the memory device of FIG. 3 transitioning to and from a low power refresh mode.

The operation of the SDRAM 300 shown in FIG. 5 assumes that syndrome bits have been created and stored for all of the rows of memory cells in the SDRAM 300. However, it may be possible for an exit self-refresh command to be applied to the SDRAM 300 before syndrome bits have been created and stored for rows of memory cells. For this reason, in another embodiment of the invention, the SDRAM 300 may check at step 416 to ensure that a minimum refresh period has lapsed. The minimum refresh period would provide sufficient time for syndrome bits to be created and stored for every row of memory cells in the SDRAM 300. Alternatively, a mode bit could be set in the mode register to cause the SDRAM 300 to operate in a conventional self-refresh mode without the use of ECC.

In another embodiment of the invention, the ECC generator checker 346 records the identity of rows containing one or more memory cells that tend not to be able to retain data during refreshes. The ECC generator checker 346 and/or the ECC controller 370 can then schedule extra refreshes of these rows.

Although the present invention has been described with reference to the disclosed embodiments, persons skilled in the art will recognize that changes may be made in form and detail without departing from the spirit and scope of the invention. For example, although the reduced power refresh mode has been described in the context of a self-refresh reduced power mode, it will be understood that it may also be used in other refresh modes, particularly where a large number of rows are sequentially refreshed. Further, although the ECC capability is provided to allow the refresh rate to be reduced for the purpose of saving power, the same ECC capability may be used during normal operation. However, it is assumed that normal refresh occurs at a sufficient rate that data retention errors are not generated. Nevertheless, the ECC capability can be used during normal operation to correct other types of errors. Finally, although the syndromes are used to check and correct stored data only when exiting the reduced power refresh mode, it should be understood that they can alternatively be used to check and correct the stored data during refreshes in the reduced power refresh mode. Other variations will also be apparent to one skilled in the art. Accordingly, the invention is not limited except as by the appended claims.

We claim:

1. A method of refreshing an array of memory cells arranged in rows and columns in a dynamic random access memory ("DRAM") device, the method comprising:

alternately refreshing the memory cells in the array in either a normal operating mode or a reduced power refresh mode;

refreshing the memory cells in a first plurality of the rows at a first rate in the normal operating mode;

refreshing the memory cells in a second plurality of the rows at a second rate in the reduced power refresh mode, the second rate being significantly slower than the first rate;

prior to transitioning from the normal operating mode to the reduced power refresh mode:
  reading data from the memory cells in a third plurality of the rows;
  generating syndromes for the data read from the memory cells in the third plurality of the rows; and
  storing the syndromes; and after transitioning from the reduced power refresh mode to the normal operating mode:
  reading data from the memory cells in a fourth plurality of the rows;
  obtaining the stored syndromes;
  using the obtained syndromes to check for errors in the data read from the memory cells;
  using the obtained syndromes to correct any data read from the memory cells that have been found to be in error thereby providing corrected data; and
  writing the corrected data to the memory cells in the array.

2. The method of claim 1 wherein the second plurality of rows comprises less than all of the rows in the array of memory cells.

3. The method of claim 1 wherein the act of storing the syndromes comprises storing the syndromes in the DRAM device.

4. The method of claim 3 wherein the act of storing the syndromes in the DRAM device comprises storing the syndromes in the array of memory cells.

5. The method of claim 1 wherein the reduced power refresh mode comprises a reduced power self-refresh mode.

6. The method of claim 1 wherein the act of generating syndromes for the data read from the memory cells in the third plurality of the rows comprises generating a single syndrome for all of the data stored in each of the rows.

7. The method of claim 6 wherein the act of reading data from the memory cells in a third plurality of the rows comprises:
  reading a plurality of groups of data in each of the rows in the third plurality; and
  accumulating all of the groups of data until data from the entire row in the third plurality have been read so that the single syndrome can be generated from the accumulated groups of data.

8. The method of claim 1 wherein the act of generating syndromes for the data read from the memory cells in the third plurality of the rows comprises generating a plurality of syndromes for the data stored in each of the rows.

9. The method of claim 8 wherein the act of storing the syndromes comprises writing the syndromes to the array of memory cells in a burst write mode.

10. The method of claim 1, further comprising recording the rows of memory cells containing data found to be in error.

11. The method of claim 10, further comprising scheduling extra refreshes of the recorded rows of memory cells.

12. The method of claim 11 wherein the act of scheduling extra refreshes of the recorded rows of memory cells comprises scheduling extra refreshes of the recorded rows of memory cells during operation in the reduced power refresh mode.

13. The method of claim 11 wherein the act of scheduling extra refreshes of the recorded rows of memory cells comprises scheduling extra refreshes of the recorded rows of memory cells during operation in the normal operating mode.

14. The method of claim 1, further comprising:
  reading data from the memory cells in the normal operating mode;
  each time data are read from the memory cells in the normal operating mode, obtaining the stored syndrome corresponding to the read data;
  using the obtained syndrome to check for errors in the data read from the memory cells;
  using the obtained syndrome to correct any data read from the memory cells that have been found to be in error; and
  writing the corrected data to the memory cells in the array.

15. The method of claim 1 wherein the second plurality of rows are identical to the first plurality of rows.

16. The method of claim 15 wherein the third plurality of rows are identical to the second plurality of rows.

17. The method of claim 16 wherein the fourth plurality of rows are identical to the third plurality of rows.

18. The method of claim 1, further comprising remaining in the reduced power refresh mode for a period of sufficient duration to allow data to be read from all of the memory cells in the DRAM device, syndromes to be generated for all of the read data, and the generated syndromes to be stored.

19. The method of claim 1, further comprising adjusting the refresh rate in either the normal operating mode or the reduced power refresh mode based on the number of errors in the data read from the memory cells.

20. A method of refreshing rows of memory cells, comprising:
  prior to refreshing the rows of memory cells:
    reading data from each of the rows of memory cells;
    generating syndromes corresponding to the read data; and
    storing the syndromes;
  refreshing the rows of memory cells without using the syndromes to determine if there are errors in the data stored in the rows of memory cells; and
  after refreshing the rows of memory cell:
    reading data from the rows of memory cells;
    using the stored syndromes to determine if there are errors in the data stored in the rows of memory cells; and
    using the stored syndromes to correct the errors in the data stored in the rows of memory cells to provide corrected data.

21. The method of claim 20 further comprising writing the corrected data to the rows of memory cells.

22. The method of claim 20 wherein the act of storing the syndromes comprises storing the syndromes in the memory cells.

23. The method of claim 20 wherein the act of generating syndromes corresponding to the read data comprises generating a single syndrome for all of the data stored in each of the rows.

24. The method of claim 20 wherein the act of reading data from each of the rows of memory cells comprises:
  reading a plurality of groups of data in each of the rows; and
  accumulating all of the groups of data until data from substantially all of the memory cells in each row have been read so that the single syndrome can be generated from the accumulated groups of data.

25. The method of claim 20 wherein the act of generating syndromes corresponding to the read data comprises generating a plurality of syndromes for the data stored in each of the rows.

26. The method of claim 25 wherein the act of storing the syndromes comprises writing the syndromes for each row to the array of memory cells in a burst write mode.

27. The method of claim 20, further comprising recording the rows of memory cells containing data found to be in error.

28. The method of claim 27, further comprising scheduling extra refreshes of the recorded rows of memory cells.

29. The method of claim 20, further comprising:
reading data from the memory cells in the normal operating mode;
each time data are read from the memory cells in the normal operating mode, obtaining the stored syndrome corresponding to the read data;
using the obtained syndrome to check for errors in the data read from the memory cells;
using the obtained syndrome to correct any data read from the memory cells that have been found to be in error; and
writing the corrected data to the memory cells in the array.

30. The method of claim 20, further comprising adjusting the refresh rate based on the number of errors in the data read from the memory cells.

31. A memory device, comprising:
an array of memory cells arranged in rows and columns;
an address decoder receiving row addresses and column addresses, the address decoder being operable to activate a row of memory cells corresponding to each received row address and to select a memory cell in a column of memory cells corresponding to each received column address;
a read data path operable to couple read data from selected memory cells in an activated row to a plurality of data bus terminals;
a write data path operable to couple write data from the plurality of data bus terminals to selected memory cells in an activated row;
refresh circuitry operable to refresh the memory cells at a relatively high rate in a normal operating mode and to refresh the memory cells at a relatively low rate in a reduced power refresh mode;
error checking and correcting logic coupled to the read data path and the write data path, the error checking and correcting logic being operable to generate an error checking and correcting syndrome from data coupled to the error checking and correcting logic, the error checking and correcting logic further being operable to use the syndrome to check and correct data coupled to the error checking and correcting logic; and
control logic operable to cause the write data to be coupled from the data bus terminals to the array of memory cells and to cause the read data to be coupled from the array of memory cells to the data bus terminals, the control logic further being operable prior to operating in the reduced power refresh mode to couple data stored in a plurality of rows of memory cells to the error checking and correcting logic to allow the error checking and correcting logic to generate syndromes corresponding to the stored data, the control logic further being operable to then store the generated syndromes, the control logic further being operable after operating in the reduced power refresh mode to couple the stored syndromes and the data stored in a plurality of rows of memory cells to the error checking and correcting logic to allow the error checking and correcting logic to check and correct the stored data, the control logic further being operable to write data corrected by the error checking and correcting logic to the memory cells.

32. The memory device of claim 31 wherein the control logic is operable to cause the generated syndromes to be stored in the memory cells.

33. The memory device of claim 31 wherein the reduced power refresh mode comprises a self-refresh mode.

34. The memory device of claim 31 wherein the control logic further comprises a mode register that includes refresh mode bits that can be set to cause the memory device to operate in the normal operating mode and can be set to cause the memory device to operate in the reduced power refresh mode.

35. The memory device of claim 31 wherein the control logic is operable to couple all of the data stored in each of the rows to the error checking and correcting logic, and wherein the error checking and correcting logic is operable to generate a single syndrome for all of the data stored in each of the rows.

36. The memory device of claim 31 wherein the control logic is operable to cause a plurality of groups of data in each of the rows to be coupled to the error checking and correcting logic.

37. The memory device of claim 36 wherein the error checking and correcting logic is operable to accumulate all of the groups of data until data from the entire row have been read, and wherein the error checking and correcting logic is further operable to generate a single syndrome from the accumulated groups of data.

38. The memory device of claim 31 wherein the error checking and correcting logic is operable to generate a plurality of syndromes for the data stored in each of the rows.

39. The memory device of claim 31, further comprising a syndrome memory coupled to the error checking and correcting logic, the syndrome memory receiving and storing the generated error checking and correcting syndromes.

40. The memory device of claim 39 wherein the syndrome memory comprises the memory cells in an array that includes the memory cells in which the data coupled to the an error checking and correcting syndrome are stored.

41. The memory device of claim 31 wherein the memory device comprises a dynamic random access memory device.

42. The memory device of claim 31 wherein the column interface circuitry comprises:
a first set of column steering logic coupled to the array of memory cells, the first set of column steering logic being operable to select a subset of read data bits from a corresponding subset of columns of the array of memory cells and to couple the selected subset of read data bits to the error checking and correcting logic; and
a second set of column steering logic coupled to the error checking and correcting logic, the second set of column steering logic being operable to select a subset of read data bits from the subset of read data bits selected by the first set of column steering logic and coupled to the error checking and correcting logic.

43. The memory device of claim 31, further comprising remaining in the reduced power refresh mode for a period of sufficient duration to allow data to be read from all of the memory cells in the DRAM device, syndromes to be generated for all of the read data, and the generated syndromes to be stored.

44. The memory device of claim 31, further comprising adjusting the refresh rate in either the normal operating mode or the reduced power refresh mode based on the number of errors in the data read from the memory cells.

45. A computer system, comprising:
a processor;
a memory device, comprising:
an array of memory cells arranged in rows and columns;
an address decoder receiving row addresses and column addresses, the address decoder being operable to activate a row of memory cells corresponding to each received row address and to select a memory cell in a column of memory cells corresponding to each received column address;
a read data path operable to couple read data from selected memory cells in an activated row to a plurality of data bus terminals;
a write data path operable to couple write data from the plurality of data bus terminals to selected memory cells in an activated row;
refresh circuitry operable to refresh the memory cells at a relatively high rate in a normal operating mode and to refresh the memory cells at a relatively low rate in a reduced power refresh mode;
error checking and correcting logic coupled to the read data path and the write data path, the error checking and correcting logic being operable to generate an error checking and correcting syndrome from data coupled to the error checking and correcting logic, the error checking and correcting logic further being operable to use the syndrome to check and correct data coupled to the error checking and correcting logic; and
control logic operable to cause the write data to be coupled from the data bus terminals to the array of memory cells and to cause the read data to be coupled from the array of memory cells to the data bus terminals, the control logic further being operable prior to operating in the reduced power refresh mode to couple data stored in a plurality of rows of memory cells to the error checking and correcting logic to allow the error checking and correcting logic to generate syndromes corresponding to the stored data, the control logic further being operable to then store the generated syndromes, the control logic further being operable after operating in the reduced power refresh mode to couple the stored syndromes and the data stored in a plurality of rows of memory cells to the error checking and correcting logic to allow the error checking and correcting logic to check and correct the stored data, the control logic further being operable to write data corrected by the error checking and correcting logic to the memory cells; and
a memory controller coupled to the processor and to the memory device, the memory controller being operable to cause the memory device to write data applied to the data bus terminals of the memory device and to read data that is coupled from the data bus terminals of the memory device.

46. The computer system of claim 45 wherein the control logic is operable to cause the generated syndromes to be stored in the memory cells.

47. The computer system of claim 45 wherein the reduced power refresh mode comprises a self-refresh mode.

48. The computer system of claim 45 wherein the control logic further comprises a mode register that includes refresh mode bits that can be set to cause the memory device to operate in the normal operating mode and can be set to cause the memory device to operate in the reduced power refresh mode.

49. The computer system of claim 45 wherein the control logic is operable to couple all of the data stored in each of the rows to the error checking and correcting logic, and wherein the error checking and correcting logic is operable to generate a single syndrome for all of the data stored in each of the rows.

50. The computer system of claim 45 wherein the control logic is operable to cause a plurality of groups of data in each of the rows to be coupled to the error checking and correcting logic.

51. The computer system of claim 50 wherein the error checking and correcting logic is operable to accumulate all of the groups of data until data from the entire row have been read, the error checking and correcting logic further being operable to generate a single syndrome from the accumulated groups of data.

52. The computer system of claim 45 wherein the error checking and correcting logic is operable to generate a plurality of syndromes for the data stored in each of the rows.

53. The computer system of claim 45, further comprising a syndrome memory coupled to the error checking and correcting logic, the syndrome memory receiving and storing the generated error checking and correcting syndromes.

54. The computer system of claim 53 wherein the syndrome memory comprises the memory cells in an array that includes the memory cells in which the data coupled to the an error checking and correcting syndrome are stored.

55. The computer system of claim 45 wherein the memory device comprises a dynamic random access memory device.

56. The computer system of claim 45 wherein the column interface circuitry comprises:
a first set of column steering logic coupled to the array of memory cells, the first set of column steering logic being operable to select a subset of read data bits from a corresponding subset of columns of the array of memory cells and to couple the selected subset of read data bits to the error checking and correcting logic; and
a second set of column steering logic coupled to the error checking and correcting logic, the second set of column steering logic being operable to select a subset of read data bits from the subset of read data bits selected by the first set of column steering logic and coupled to the error checking and correcting logic.

57. The computer system of claim 45, further comprising remaining in the reduced power refresh mode for a period of sufficient duration to allow data to be read from all of the memory cells in the DRAM device, syndromes to be generated for all of the read data, and the generated syndromes to be stored.

58. The computer system of claim 45, further comprising adjusting the refresh rate in either the normal operating mode or the reduced power refresh mode based on the number of errors in the data read from the memory cells.

* * * * *